United States Patent
Loboda et al.

[19]

[11] Patent Number: 5,818,071
[45] Date of Patent: Oct. 6, 1998

[54] SILICON CARBIDE METAL DIFFUSION BARRIER LAYER

[75] Inventors: Mark Jon Loboda; Keith Winton Michael, both of Midland, Mich.

[73] Assignee: Dow Corning Corporation, Midland, Mich.

[21] Appl. No.: 382,701

[22] Filed: Feb. 2, 1995

[51] Int. Cl.$^6$ .................. H01L 31/0312; H01L 29/04; H01L 31/036; H01L 31/0376
[52] U.S. Cl. .................. 257/77; 257/55; 257/63
[58] Field of Search .................. 257/77, 55, 63, 257/58, 444

[56] References Cited

U.S. PATENT DOCUMENTS

| | | | |
|---|---|---|---|
| 4,224,636 | 9/1980 | Yonezawa et al. | 257/77 |
| 4,532,150 | 7/1985 | Endo et al. | |
| 4,559,552 | 12/1985 | Yamazaki | 257/77 |
| 4,647,472 | 3/1987 | Hiraki et al. | |
| 5,103,285 | 4/1992 | Furumura et al. | |
| 5,274,268 | 12/1993 | Yamazaki | 257/663 |
| 5,563,102 | 10/1996 | Michael | 437/209 |

FOREIGN PATENT DOCUMENTS

| | | |
|---|---|---|
| 50-91416 | 2/1977 | Japan . |
| 63-150963 | 6/1988 | Japan ............ H01L 29/78 |

OTHER PUBLICATIONS

"Semiconductor Devices" Physics and Technology; p. 372; S.M. Size.
"Semiconductors", p. 35, Helmut F. Wolf.
Chiang, C. et al., Components Research, Intel Corp., "Dielectric Barrier Study for Cu Metallization", Jun. 7–8, 1994 VMIC Conference 1994 ISMIC —103/94/0414.

*Primary Examiner*—Mahshid D. Saadat
*Assistant Examiner*—Jhihan B. Clark
*Attorney, Agent, or Firm*—Sharon K. Severance

[57] ABSTRACT

Disclosed is the use of silicon carbide as a barrier layer to prevent the diffusion of metal atoms between adjacent conductors separated by a dielectric material. This advancement allows for the use of low resistivity metals and low dielectric constant dielectric layers in integrated circuits and wiring boards.

15 Claims, 1 Drawing Sheet

SILICON CARBIDE METAL DIFFUSION BARRIER LAYER

BACKGROUND OF THE INVENTION

The present invention relates to the use of amorphous silicon carbide (a-SiC) films as diffusion barriers in multi-level metal integrated circuit and wiring board designs. The function of the a-SiC is to stop the migration of metal atoms between adjacent conductors which are the device interconnections in the electrical circuit. The reliability added to the circuit by the a-SiC diffusion barrier allows the use of low resistance conductors and low dielectric constant materials as insulation media between the conductors. The combination of the low resistance conductors, the a-SiC diffusion barrier and the low dielectric constant insulation minimizes the electrical impedance of the circuit. This permits the circuit to operate efficiently from low to high frequencies.

Chiang et al. in "Dielectric Barrier Study for Copper Metallization" (VMIC Conference Jun. 7–8, 1994) discuss the diffusion of copper into silicon nitride, silicon oxynitride and silicon oxide dielectrics. The reference teaches that silicon nitride and silicon oxynitride were much better barriers to metal migration than silicon oxides. The reference, however, does not discuss the use of silicon carbide as a barrier.

Furumura et al. in U.S. Pat. No. 5,103,285 teach the use of silicon carbide as a barrier layer between a silicon substrate and a metal wiring layer. The reference does not, however, teach the use of silicon carbide as a diffusion barrier layer between metal wiring and adjacent dielectric layers.

The present inventor has discovered that silicon carbide forms an excellent barrier layer to prevent the diffusion of low resistance metal conductors into dielectric layers.

SUMMARY OF THE INVENTION

The present invention relates to an improved integrated circuit having greater speed of operation and reliability. The circuit comprises a subassembly of solid state devices formed into a substrate made of a semiconducting material. The devices within the subassembly are connected by metal wiring formed from high conductivity, low resistance metals. A diffusion barrier layer of amorphous silicon carbide is formed on at least the metal wiring. A dielectric layer is then formed on the silicon carbide layer.

DETAILED DESCRIPTION

Figure 1:
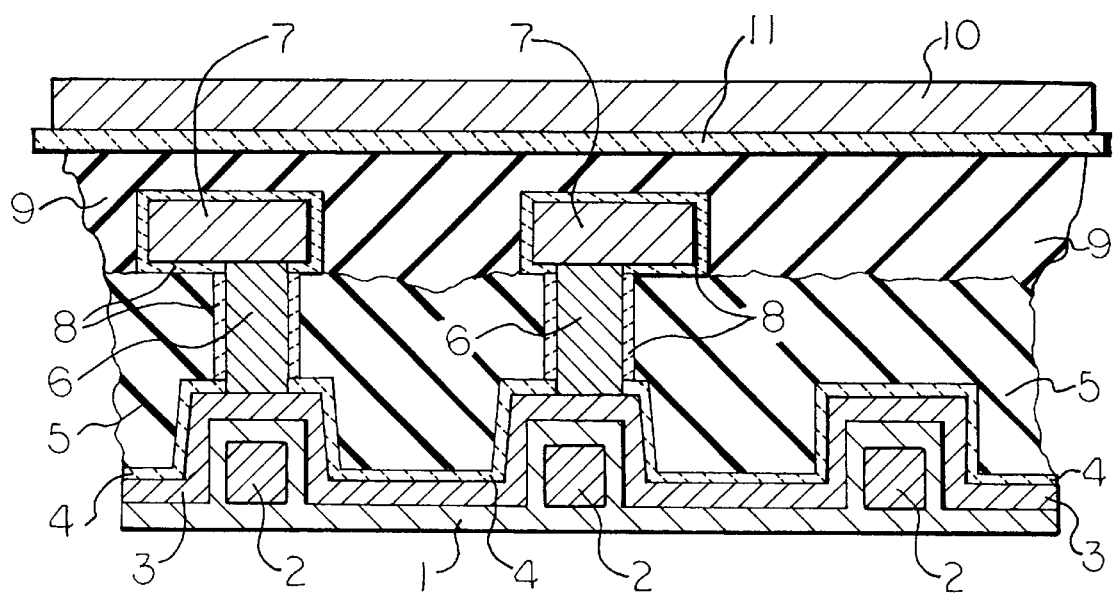
FIG. 1 is a cross-section of a device of the present invention.

The present invention is based on the unexpected discovery that amorphous silicon carbide can stop the migration of metal atoms between adjacent device interconnections in the electrical circuit. This advancement allows IC manufacturers 1) the ability to use high conductivity, low resistance metals (eg., Cu, Ag, Au, alloys, superconductors) as the interconnection materials and 2) the ability to use very low dielectric constant materials as insulating layers between the metal wiring. Without the presence of the a-SiC, the combination of high conductivity metals and low dielectric constant insulating layers suffers, reliability problems such as metal migration and corrosion.

The integrated circuit subassemblies used in the process of this invention are not critical and nearly any which are known in the art and/or produced commercially are useful herein. The processes used to produce such circuits are also known and not critical to the invention. Exemplary of such circuits are those comprising a semiconductor substrate (eg., silicon, gallium arsenide, etc.) having an epitaxial layer grown thereon. This epitaxial layer is appropriately doped to form the PN-junction regions which constitute the active, solid state device regions of the circuit. These active, device regions are diodes and transistors which form the integrated circuit when appropriately interconnected by metal wiring layers. FIG. 1 depicts such a circuit subassembly (1) having device regions (2) and thin film metal wiring (3) interconnecting the devices.

The metal wiring layers on conventional integrated circuit subassemblies are generally thin films of aluminum. By using the present invention, these thin films can be made of high conductivity metals instead of aluminum. As used herein, high conductivity metals are those having a resistivity less than about 2.5 microhm-centimeters at 20° C. These include copper, silver, gold, alloys, and superconductors.

Methods for depositing such high conductivity metal layers are known in the art. The specific method utilized is not critical. Examples of such processes include various physical vapor deposition (PVD) techniques such as sputtering and electron beam evaporation.

According to the invention, a silicon carbide layer is applied over the metallic wiring layer. Generally, this is accomplished by coating the entire top surface of the circuit subassembly which, obviously, includes the metal wiring. This is depicted as coating (4) in FIG. 1. Alternatively, however, it is contemplated that one could selectively apply the silicon carbide on just the wiring by, for example, masking or one could coat the entire surface and etch those areas where the silicon carbide was not desired.

Methods of applying silicon carbide layers are not critical to the invention and many are known in the art. Examples of applicable methods include a variety of chemical vapor deposition techniques such as conventional CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc. These processes involve either the addition of energy (in the form of heat, plasma, etc.) to a vaporized species to cause the desired reaction or the focusing of energy on a solid sample of the material to cause its deposition.

In conventional chemical vapor deposition, the coating is deposited by passing a stream of the desired precursor gases over a heated substrate. When the precursor gases contact the hot surface, they react and deposit the coating. Substrate temperatures in the range of about 100–1000° C. are sufficient to form these coatings in several minutes to several hours, depending on the precursors and the thickness of the coating desired. If desired, reactive metals can be used in such a process to facilitate deposition.

In PECVD, the desired precursor gases are reacted by passing them through a plasma field. The reactive species thereby formed are then focused at the substrate where they readily adhere. Generally, the advantage of this process over CVD is that lower substrate temperature can be used. For instance, substrate temperatures of about 50° C. up to about 600° C. are functional.

The plasma used in such processes can comprise energy derived from a variety of sources such as electric discharges, electromagnetic fields in the radio-frequency or microwave range, lasers or particle beams. Generally preferred in most plasma deposition processes is the use of radio frequency (10 kHz–$10^2$ MHz) or microwave (0.1–10 GHz) energy at moderate power densities (0.1–5 watts/cm$^2$). The specific frequency, power and pressure, however, are generally tailored to the precursor gases and the equipment used.

Examples of suitable precursor gases for use in these processes include (1) mixtures of silane or a halosilane such as trichlorosilane in the presence of an alkane of one to six carbon atoms such as methane, ethane, propane, etc.; (2) an alkylsilane such as methylsilane, dimethylsilane and trimethylsilane; or (3) a silacyclobutane or disilacyclobutane as further described in U.S. Pat. No. 5,011,706, which is incorporated herein in its entirety.

Especially preferred in the present invention is the plasma enhanced chemical vapor deposition of trimethylsilane.

After the silicon carbide is deposited, a dielectric layer is then applied over the silicon carbide layer. This is shown as interlevel dielectric layer (5) in FIG. 1. The specific dielectric layer and the method for its deposition is not critical to the invention. By using the process of the present invention, however, one can utilize low dielectric constant layers. As used herein, low dielectric constant layers are those with a DK less than about 3.5.

Examples of suitable dielectric materials include silicon oxides, silicon nitrides, silicon oxynitrides, silicon carbides, silicon oxycarbides, silicon carbonitrides, organic materials such as silicone, polyimide, epoxy, or PARYLENE™, and the like. Obviously, more than 1 layer of these dielectrics may be used.

The techniques for applying these coatings are also known in the art. They include spin-on processes, conventional CVD, photochemical vapor deposition, plasma enhanced chemical vapor deposition (PECVD), electron cyclotron resonance (ECR), jet vapor deposition, etc. and a variety of physical vapor deposition techniques such as sputtering, electron beam evaporation, etc.

The preferred process in the present invention comprises applying a hydridosiloxane resin having units of the structure HSi(OH)$_x$(OR)$_y$O$_{z/2}$ in which each R is independently an organic group which, when bonded to silicon through the oxygen atom, forms a hydrolyzable substituent, x=0–2, y=0–2, z=1–3, and x+y+z =3. These resins may be either fully condensed (x=0, y=0 and z=3) or they may be only partially hydrolyzed (y does not equal 0 over all the units of the polymer) and/or partially condensed (x does not equal 0 over all the units of the polymer). Although not represented by this structure, various units of these resins may have either zero or more than one Si-H bond due to various factors involved in their formation and handling.

Exemplary of these resins are those formed by the process of Collins et al. in U.S. Pat. No. 3,615,272, those of Bank et al. in U.S. Pat. No. 5,010,159, those of Weiss et al. in U.S. Pat. No. 4,999,397, and those of Hanneman et al. in U.S. Pat. 5,063,267, all of which are incorporated herein by reference. These resins are applied by a spin-on process followed by hearing to convert them to a ceramic.

If desired for a multilayer device, one can form another layer of metal wiring on the dielectric layer and interconnect the layers by etching through the dielectric and the silicon carbide layers. FIG. 1 shows such a second metal wiring layer (7) which is interconnected with selected regions of the first layer of wiring by interconnects (6). Again, however, if the wiring is to be a high conductivity material, a layer of silicon carbid (8) should be deposited between the dielectric and the metal to prevent diffusion of the metal into the dielectric. This silicon carbide layer can be formed as described above. In such a manner, the metal wiring is sandwiched between layers of silicon carbide. This process can be repeated many times for the various layers of metallization within a circuit. FIG. 1, for example, shows a second layer of dielectric (9), a third layer of wiring (10) protected by a third layer of silicon carbide (11).

It should be noted that silicon carbide with a low dielectric constant (eg., <5) could also replace the dielectric layer (i.e., layers 5 and 9 in FIG. 1). In this embodiment of the invention, one would merely form a layer of silicon carbide over a metal wiring layer as described above and then form another metal layer on the silicon carbide.

It should also be noted that this technology can be applied to the wiring boards onto which the above circuits are mounted. The structure of the metal wiring and dielectric layers on these wiring boards would be the same as that described above.

That which is claimed is:
1. An integrated circuit comprising:
A) a circuit subassembly comprising a semiconductor substrate having solid state device regions and, deposed on the surface of the semiconductor substrate, metal wiring interconnecting the solid state device regions, the metal wiring having a resistivity less than about 2.5 microhm-centimeters;
B) an amorphous silicon carbide layer covering at least the metal wiring; and
C) a dielectric layer covering at least the silicon carbide layer.
2. The integrated circuit of claim 1 wherein the amorphous silicon carbide covers the metal wiring and the surface of the circuit subassembly containing the device regions.
3. The integrated circuit of claim 1 wherein the dielectric layer is selected from the group consisting of silicon oxides, silicon nitrides, silicon oxynitrides, silicon carbides, silicon oxycarbides, silicon carbonitrides, and organic materials.
4. The integrated circuit of claim 1 wherein the dielectric layer has a dielectric constant of less than about 3.5.
5. The integrated circuit of claim 1 wherein the dielectric layer is a silicon oxide.
6. The integrated circuit of claim 1 wherein the metal wiring is thin film metal wiring.
7. The integrated circuit of claim 1 wherein the metal wiring is selected from the group consisting of copper, silver, gold, alloys, and superconductors.
8. The integrated circuit of claim 1 wherein the metal wiring is copper.
9. The integrated circuit of claim 1 further comprising a second amorphous silicon carbide layer covering the dielectric layer.
10. The integrated circuit of claim 9 further comprising a second layer of metal wiring formed on the second layer of silicon carbide, wherein the second layer of metal wiring is electrically connected to the first layer of metal wiring.
11. An integrated circuit comprising:
A) a circuit subassembly comprising a semiconductor substrate having solid state device regions and, deposed on the surface of the semiconductor substrate, metal wiring interconnecting the solid state device regions, the metal wiring having a resistivity less than about 2.5 microhm-centimeters;
B) an amorphous silicon carbide layer covering the metal wiring; and C) a second layer of metal wiring formed on the layer of amorphous silicon carbide, wherein the second layer of metal wiring is electrically connected to the first layer of metal wiring.

12. The integrated circuit of claim 11 wherein the metal wiring is thin film metal wiring.

13. The integrated circuit of claim 11 wherein the metal wiring is selected from the group consisting of copper, silver, gold, alloys, and superconductors.

14. The integrated circuit of claim 11 wherein the metal wiring is copper.

15. A wiring board comprising:

A) a wiring board subassembly containing thereon metal wiring having a resistivity less than about 2.5 microhm-centimeters;

B) an amorphous silicon carbide layer covering the metal wiring; and

C) a dielectric layer covering the silicon carbide layer.

* * * * *